United States Patent
Jeon et al.

(10) Patent No.: US 11,169,283 B2
(45) Date of Patent: Nov. 9, 2021

(54) PIXEL ARRAY PANEL AND DIGITAL X-RAY DETECTOR COMPRISING THE SAME

(71) Applicant: LG Display Co., Ltd., Seoul (KR)

(72) Inventors: HyeJi Jeon, Changwon-si (KR); Hanseok Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 36 days.

(21) Appl. No.: 16/719,555

(22) Filed: Dec. 18, 2019

(65) Prior Publication Data
US 2020/0200925 A1 Jun. 25, 2020

(30) Foreign Application Priority Data
Dec. 24, 2018 (KR) .................. 10-2018-0168295

(51) Int. Cl.
| | |
|---|---|
| *G01T 1/16* | (2006.01) |
| *G01T 1/24* | (2006.01) |
| *G01T 1/20* | (2006.01) |
| *H01L 27/146* | (2006.01) |
| *H01L 31/115* | (2006.01) |

(52) U.S. Cl.
CPC ............ *G01T 1/241* (2013.01); *G01T 1/2018* (2013.01); *H01L 27/14663* (2013.01); *H01L 27/14676* (2013.01); *H01L 31/115* (2013.01)

(58) Field of Classification Search
CPC ....... G01T 1/241; G01T 1/2018; G01T 1/244; H01L 27/14676; H01L 31/115; H01L 27/14663; H01L 27/14636; H01L 27/1462; H01L 27/14612; H01L 31/035281; H01L 31/1055; H01L 31/105; H01L 31/035272; H01L 27/14658; H01L 27/14603; H01L 31/085
See application file for complete search history.

(56) References Cited

U.S. PATENT DOCUMENTS

2015/0204987 A1* 7/2015 Okada .................... G01T 1/202
250/369

* cited by examiner

*Primary Examiner* — David P Porta
*Assistant Examiner* — Mamadou Faye
(74) *Attorney, Agent, or Firm* — Polsinelli PC

(57) ABSTRACT

Disclosed is a pixel array panel for a digital X-ray detector, the pixel array panel including a plurality of pixel regions, wherein the pixel array panel includes: a first electrode corresponding to each pixel region; a plurality of PIN (P-type/I-type/N-type semiconductors) layers disposed on the first electrode and arranged in a matrix form; and a second electrode disposed on each PIN layer.

20 Claims, 17 Drawing Sheets

PIXEL ARRAY PANEL AND DIGITAL X-RAY DETECTOR COMPRISING THE SAME

CROSS REFERENCE TO RELATED APPLICATION

This application claims the priority of Korean Patent Application No. 10-2018-0168295 filed on Dec. 24, 2018, which is hereby incorporated by reference in its entirety.

BACKGROUND

Field of the Disclosure

The present disclosure relates to a pixel array panel for a digital X-ray detector (DXD) for detecting X-ray transmission and a digital X-ray detector including the same.

Description of the Background

X-ray is an electromagnetic wave having permeability. A transmission of the X-ray corresponds to a density inside an object. Therefore, an X-ray image is widely used in medical, security and industrial fields. In particular, the X-ray image is frequently used as a basic diagnostic tool in the medical field.

A conventional X-ray image is realized by providing a film made of a photosensitive material, exposing the film to an X-ray transmitting the object, and then transferring an image of the film to a printing paper. In this case, there is a problem that the image information cannot be provided in real time due to a printing process, and the image information may be easily lost due to inability to store the film for a long time.

In recent years, due to development of video processing technology and semiconductor technology, a digital X-ray detector with a flat panel structure that may replace the film has been proposed.

A typical digital X-ray detector includes a pixel array panel in a form of a flat plate. The pixel array panel includes a plurality of pixel regions, and a photo-sensing element corresponding to each pixel region. The photo-sensing element includes first and second electrodes and a PIN layer disposed between the first and second electrodes.

In this connection, the PIN layer may generally be about a 1 μm thick and amorphous silicon (inorganic material, a-Si) layer. The PIN layer is disposed in an area as wide as possible in each pixel region in order to optimize a fill factor of each pixel region corresponding to an optical sensitivity. In this connection, the fill factor may correspond to a ratio of an area receiving the PIN layer in which electron-hole pairs are generated in response to light to a total area of each pixel region.

As described above, the PIN layer made of the inorganic material and having a thickness of about 1 μm is disposed in the area as wide as possible in each pixel region. Thus, there is a problem in that the pixel array panel is vulnerable to a bending stress.

When the array panel is embodied in a bendable, foldable or rollable manner while including a flexible substrate, the PIN layer may vulnerable to the bending stress that cause crack or break. Thus, the optical sensitivity of a portion of the pixel region is lowered, and thus accuracy and reliability of the X-ray image are deteriorated.

SUMMARY

Accordingly, the present disclosure provides a pixel array panel and a digital X-ray detector including the same, in which the pixel array panel may be implemented in a bendable, foldable or rollable manner.

The present disclosure is not limited to the above-mentioned purpose. Other purposes and advantages of the present disclosure as not mentioned above may be understood from following descriptions and more clearly understood from aspects of the present disclosure. Further, it will be readily appreciated that the purposes and advantages of the present disclosure may be realized by features and combinations thereof as disclosed in the claims.

In a first aspect of the present disclosure, there is proposed a pixel array panel for a digital X-ray detector, the pixel array panel including a plurality of pixel regions, wherein the pixel array panel includes: a first electrode corresponding to each pixel region; a plurality of PIN (P-type/I-type/N-type semiconductors) layers disposed on the first electrode and arranged in a matrix form; and a second electrode disposed on each PIN layer.

In one implementation, the pixel array panel further includes: a substrate having the plurality of pixel regions; a single thin film transistor disposed on the substrate and corresponding to each pixel region; a first planarization film covering the thin film transistor; a first protective film disposed on the first planarization film; a second protective film disposed on the first protective film and covering the first electrode, the PIN layers and the second electrodes; a second planarization film disposed on the second protective film; a bias line disposed on the second planarization film; and a bridge pattern disposed on the second planarization film and connecting each second electrode and the bias line to each other, wherein the first electrode is disposed on the first protective film, wherein the bridge pattern is connected to each second electrode via a bias contact hole which passes through the second protective film and the second planarization film, wherein the bridge pattern overlaps at least a portion of the bias line.

In one implementation, the first electrode is in contact with the second protective film in a space region between adjacent PIN layers among the plurality of PIN layers corresponding to each pixel region.

In one implementation, a spacing between two adjacent PIN layers among the plurality of PIN layers corresponding to each pixel region is 2 μm or greater.

In one implementation, the bias line extends in a first direction, wherein the bridge pattern is connected to at least two second electrodes arranged in a second direction perpendicular to the first direction.

In one implementation, the first electrode of each pixel region is connected to the thin film transistor of each pixel region via a first pixel contact hole which passes through the first planarization film and a second pixel contact hole which corresponds to the first pixel contact hole and passes through the first protective film.

In one implementation, the thin film transistor includes: an active layer disposed on the substrate; a gate insulating layer disposed on a portion of the active layer; a gate electrode disposed on the gate insulating layer and connected to the gate line; an interlayer insulating film covering the active layer and the gate electrode; and a source electrode and a drain electrode disposed on the interlayer insulating film, wherein one of the source electrode and the drain electrode is connected to the first electrode via the first and second pixel contact holes, while the other thereof is connected to the data line.

In one implementation, the gate line extends in a first direction and is disposed on the gate insulating layer, wherein the data line extends in a second direction perpendicular to the first direction and is disposed on the interlayer insulating film.

In one implementation, the bias line extends in the second direction and overlaps with the data line.

In one implementation, the pixel array panel further includes: a third protective film covering the bias line and the bridge pattern; a third planarization film disposed on the third protective film; and a scintillator disposed on the third planarization film.

In one implementation, the substrate is made of a soft material.

In a second aspect of the present disclosure, there is proposed a digital X-ray detector including the pixel array panel as defined above.

In a third aspect of the present disclosure, there is proposed a pixel array panel for a digital X-ray detector including a plurality of PIN layers disposed on a first electrode corresponding to each pixel region.

That is, a single PIN layer is not disposed in each pixel region, and a plurality of PIN layers is spacely arranged in a matrix form in each pixel region.

Accordingly, even when the pixel array panel is implemented in a bendable manner, the bending stress corresponding to each pixel region may be dispersed between into the plurality of PIN layers. As a result, cracking or breakage of the PIN layers due to the bending shape may be reduced.

As described above, since the pixel array panel which can be implemented in a bending manner, the pixel array panel may have high freedom in terms of installation, and deformation. Thus, an application of the pixel array panel may vary. Further, when the pixel array panel is implemented in a bendable manner, the accuracy and reliability of the X-ray image may be prevented from being degraded.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
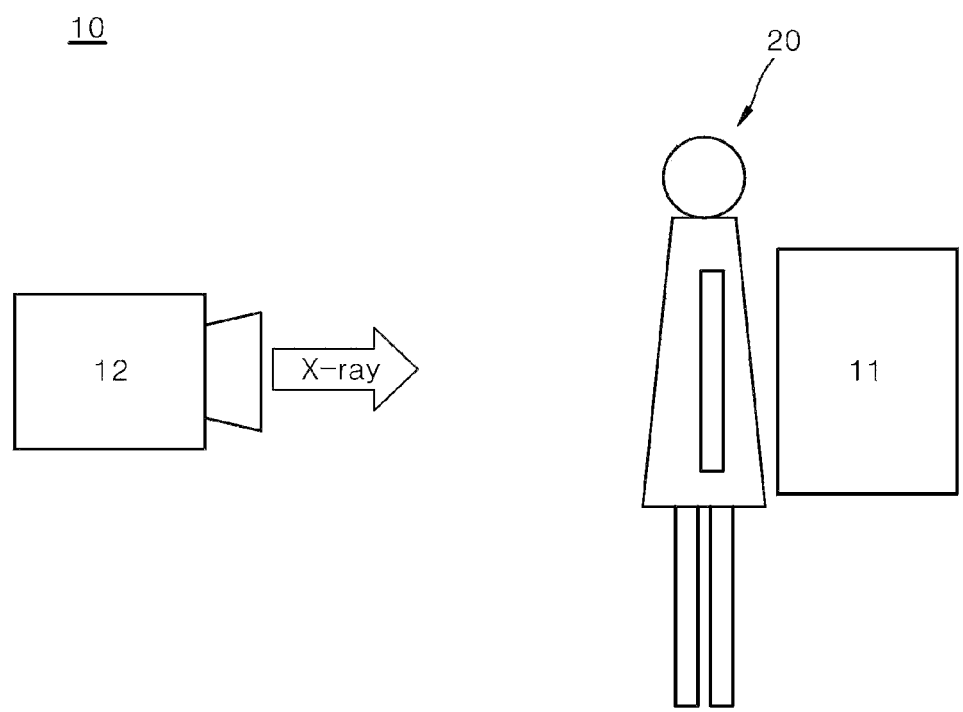
FIG. 1 shows an X-ray image system according to an aspect of the present disclosure.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

The terminology used herein is for the purpose of describing particular aspects only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a digital X-ray detector and a pixel array panel provided therein according to an aspect of the present disclosure will be described with reference to the accompanying drawings.

First, referring to FIGS. 1 to 2, a digital X-ray detector and an X-ray imaging system including the digital X-ray detector according to an aspect of the present disclosure will be described.

FIG. 1 shows an X-ray image system according to an aspect of the present disclosure. FIG. 2 shows a digital X-ray detector in FIG. 1.

As shown in FIG. 1, an X-ray imaging system 10 is configured to provide an X-ray image of an interior of a predetermined target object 20. In one example, the target object 20 may be a part of a living body to be tested or a part of an industrial process product to be inspected.

The X-ray imaging system 10 includes a digital X-ray detector 11 for detecting a transmission of an X-ray, and a light-source device 12 which faces away the digital X-ray detector 11 with the target object 20 therebetween and irradiates the X-ray to the target object 20.

The digital X-ray detector 11 may be embodied as a form of a flat panel including a sensing region for detecting the X-ray transmission through the target object 20.

Figure 2:
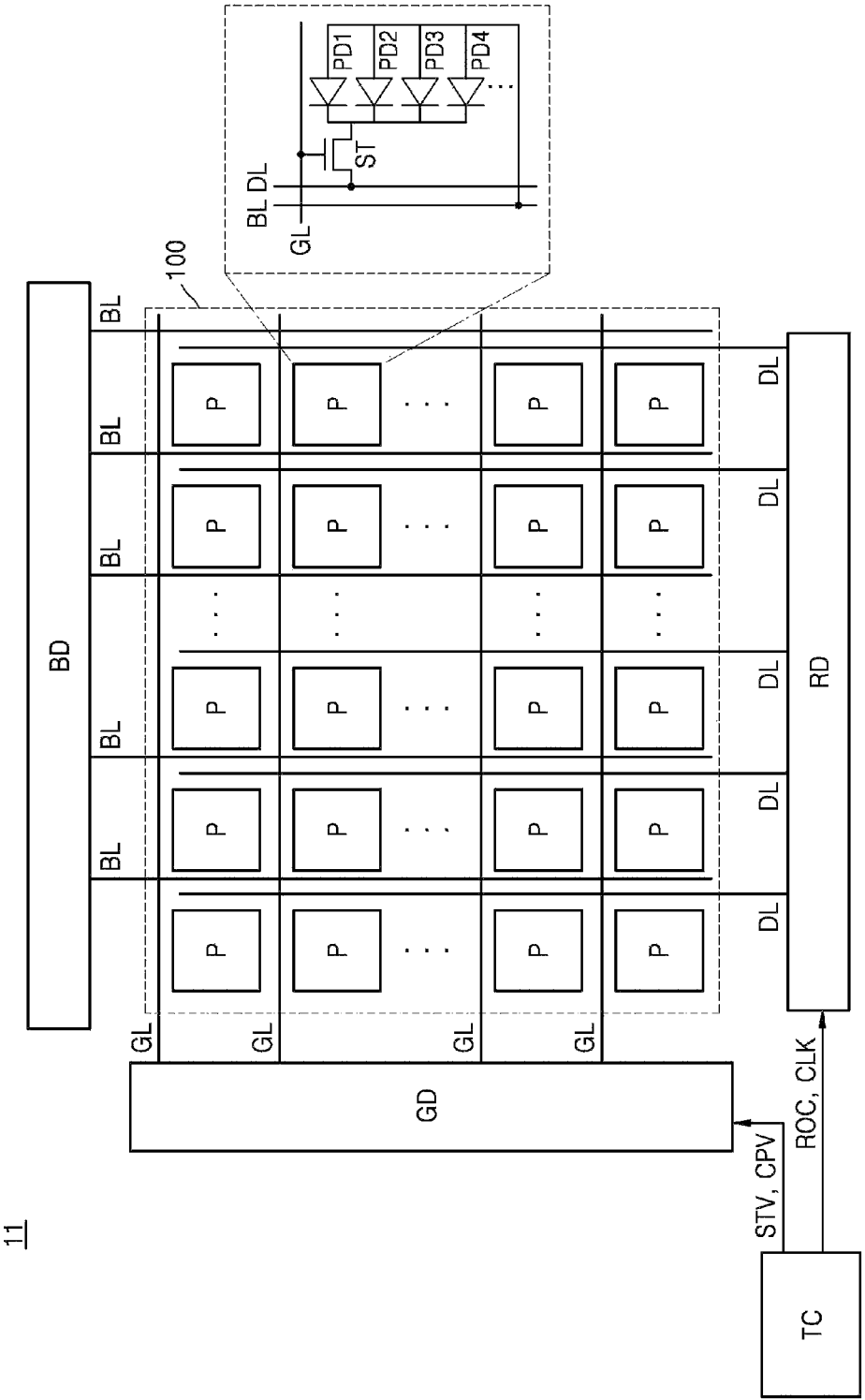
FIG. 2 shows a digital X-ray detector in FIG. 1.

As shown in FIG. 2, the digital X-ray detector 11 includes a pixel array panel 100 including a plurality of pixel regions P arranged in a matrix.

The digital X-ray detector 11 further includes a read-out driver RD for driving the pixel array panel 100; a gate driver GD, a bias driver BD, and a timing controller TC.

Although not shown in detail in FIG. 2, the gate driver GD and the bias driver BD which are composed of relatively simple circuits compared to the read-out driver RD, may be embedded in the pixel array panel 100.

Each pixel region P of the pixel array panel 100 includes a plurality of photo-sensing elements PD1, PD2, PD3, and PD4 for sensing light, and a switching thin-film transistor ST disposed between the plurality of photo-sensing elements PD1, PD2, PD3, and PD4 and a data line DL.

The pixel array panel 100 further includes a gate line GL, a data line DL, and a bias line BL connected to the plurality of pixel regions P.

For example, the gate line GL may correspond to each horizontal line of the pixel array panel 100. In this connection, each horizontal line may be composed of pixel regions P arranged in a horizontal direction (a left and right direction of FIG. 2) among the plurality of pixel regions P.

The data line DL may correspond to each vertical line of the pixel array panel 100. In this connection, each vertical line may be composed of pixel regions P arranged vertically (in an up-down direction in FIG. 2) among the plurality of pixel regions P.

Further, the bias line BL may correspond to each vertical line of the pixel array panel 100 like the data line DL. Alternatively, although not shown in FIG. 2, the bias line BL may correspond to each horizontal direction. Alternatively, the bias line BL may be configured in a form of a mesh to correspond to each vertical direction and each horizontal direction.

The pixel array panel 100 further includes a scintillator (130 in FIG. 4) placed on a face thereof facing the light-source device 12 in FIG. 1. That is, the scintillator 130 is disposed between the light-source device 12 and the photo-sensing elements PD1, PD2, PD3, and PD4. The scintillator 130 converts the X-ray into visible light.

The plurality of photo-sensing elements PD1, PD2, PD3, and PD4 disposed in each pixel region P are connected in parallel with each other. Each of the plurality of photo-sensing elements PD1, PD2, PD3, and PD4 may be embodied as a PIN diode. One end of each of the photo-sensing elements PD1, PD2, PD3, and PD4 is connected to the bias line BL, while the other end thereof is connected to the switching thin film transistor ST. For example, an anode of each of the photo-sensing elements PD1, PD2, PD3 and PD4 is connected to the bias line BL, while a cathode electrode thereof is connected to the switching thin film transistor ST.

Each photo-sensing element PD absorbs visible light from the scintillator 130 and generates electrons in response to the visible light, thereby to generate the sensing signal corresponding to the X-ray transmission. A pixel sensing signal as a sum of sensing signals from the plurality of photo-sensing elements PD1, PD2, PD3 and PD4 is transferred to the switching thin film transistor ST.

When the switching thin film transistor ST is turned on based on a gate signal of the gate line GL, the pixel sensing signal from the plurality of photo-sensing elements PD1, PD2, PD3 and PD4 is transmitted to the data line DL.

The timing controller TC supplies the gate driver GD with a start signal STV and clock signal CPV for controlling driving timing of the gate driver GD. The timing controller TC supplies, to the read-out driver RD, a read-out control signal ROC and a read-out clock signal CLK for controlling driving timing of the read-out driver RD.

The gate driver GD sequentially supplies a gate signal for turning on the switching transistors ST of pixel regions P included in each horizontal line to each gate line GL.

The bias driver BD supplies a predetermined bias signal to the bias line BL. In this connection, the bias driver BD may selectively supply a bias signal for a reverse bias operation or a bias signal for a forward bias operation.

The read-out driver RD receives the pixel sensing signal of each pixel region P of each horizontal line through the data line DL, and generates an image signal based on the received signal. For example, the read-out driver RD amplifies the pixel sensing signal, and performs correction to remove a noise signal from the amplified pixel sensing signal, and converts the corrected pixel sensing signal into a digital signal, and generates an image signal from a combination of digital signals. In this connection, the image signal may be a signal representing a luminance value corresponding to each of the plurality of pixel regions P as bit information.

FIG. 2 shows an example in which each pixel region P includes four photo-sensing element PDs. However, this is only an example. The number of the photo-sensing element PDs corresponding to each pixel region P and arranged in a matrix may vary.

Next, the pixel array panel 100 for a digital X-ray detector according to an aspect of the present disclosure will be described with reference to FIG. 3 and FIG. 4.

Figure 3:
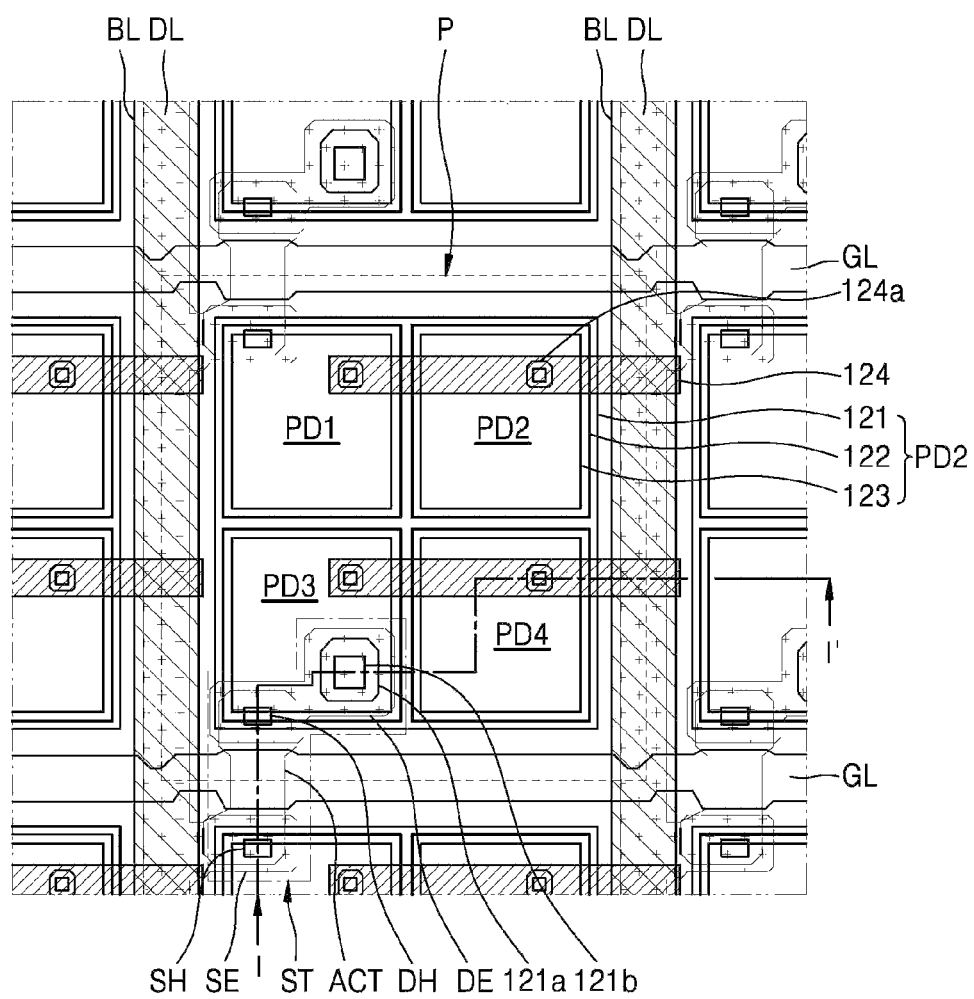
FIG. 3 shows a plan view of one pixel region of a pixel array panel of FIG. 2.

FIG. 3 shows a plan view of one pixel region of the pixel array panel of FIG. 2. FIG. 4 shows a cross sectional view taken along a line I-I' of FIG. 3.

As shown in FIG. 3, the pixel array panel 100 includes a gate line GL, which extends in a horizontal direction (a left and right direction of FIG. 3), a data line DL and a bias line BL, each extending in a vertical direction (an up and down direction in FIG. 3), and a plurality of pixel regions P.

In this connection, each of the data line DL and the bias line BL extends in the vertical direction. Accordingly, in consideration of a volume of a substrate, the data line DL and the bias line BL may define different layers separated from each other via at least one insulating film and may overlap each other.

Each pixel region P may be defined by an intersection between the gate line GL extending in the horizontal direction and the data line DL extending in the vertical direction.

The switching thin film transistor ST of each pixel region P is disposed adjacent to an intersection point between the gate line GL and the data line DL.

The photo-sensing elements PD1, PD2, PD3, and PD4, which are included in each pixel region P, are arranged in a matrix and are disposed in 4 sub pixel regions respectively.

According to FIG. 3, each pixel region P is shown to include four photo-sensing elements PD1, PD2, PD3, and PD4 arranged in a 2×2 matrix. However, this is only an example. In another example, each pixel region P may include n number of photo-sensing elements arranged in an a×b matrix (where n=a×b).

To this end, the pixel array panel 100 includes a first electrode 121 corresponding to each pixel region P, a plurality of PIN layers 122 arranged in a matrix on the first electrode 121, and a second electrode 123 disposed on each PIN layer 122.

The plurality of PIN layers 122 are spaced apart from each other in either the horizontal direction or the vertical direction. In this connection, a spacing between adjacent PIN layers 122 among the plurality of PIN layers 122 may be 2 μm or greater, in order to consider a process error and prevent a mutual interference in a process of forming the PIN layer 122.

Each of the photo-sensing elements PD1, PD2, PD3, and PD4 includes the first electrode 121 and the second electrode 122 facing each other, and the PIN layer 122 interposed between the first electrode 121 and the second electrode 122.

The first electrode 121 is connected to the switching thin film transistor ST via first and second pixel contact holes 121a and 122a.

The plurality of PIN layers 122 are connected to one first electrode 121. The second electrode 122 disposed on each PIN layer 122 is connected to the bias line BL via a bridge pattern 124. Accordingly, the plurality of photo-sensing elements PD1, PD2, PD3, and PD4 disposed in each pixel region P are connected in parallel with each other.

The bridge pattern 124 is connected to each second electrode 122 via a bias contact hole 124a.

In one example, when the bias line BL extends in a vertical direction, the bridge pattern 124 may extend in a horizontal direction perpendicular to the bias line BL. That is, the bridge pattern 124 may be connected to at least one second electrode 123, which is included in each pixel region P and extends in a horizontal direction. According to the illustration of FIG. 3, when the plurality of PIN layers 122 are arranged in a 2×2 matrix in each pixel region P, the bridge pattern 124 may be connected to two second electrodes 123 arranged in a horizontal direction in each pixel region P. Thus, an area where the bridge pattern 124 is disposed in each pixel region P may be minimized, such that degradation of a fill factor of each pixel region P due to the bridge pattern 124 may be minimized.

In this connection, the fill factor corresponds to a ratio of an area in which electron hole pairs are generated in response to light to a total area of each pixel region P. The fill factor may correspond to conversion efficiency at which the photo-sensing elements PD1, PD2, PD3, and PD4 convert light into electrical signals.

That is, the bridge pattern 124 is disposed on a top face of the PIN layer 122, thereby blocking light to be incident on the PIN layer 122. Therefore, the smaller a width of the region where the bridge pattern 124 is located in each pixel region P, the lower the degradation of the fill factor due to the bridge pattern 124. In other words, when the bridge pattern 124 corresponds to each of the photo-sensing elements PD1, PD2, PD3, and PD4, an area in which the bridge patterns 124 are disposed in each pixel region P is larger. Thus, the fill factor may be greatly reduced due to the bridge pattern 124.

In one example, FIG. 3 shows the bridge pattern 124 extending in the horizontal direction. However, this is only an example. In another example, when the bias line BL extends in the horizontal direction, the bridge pattern 124 may be connected to at least two second electrode 123, which are included in each pixel region P and arranged in a vertical direction.

Figure 4:
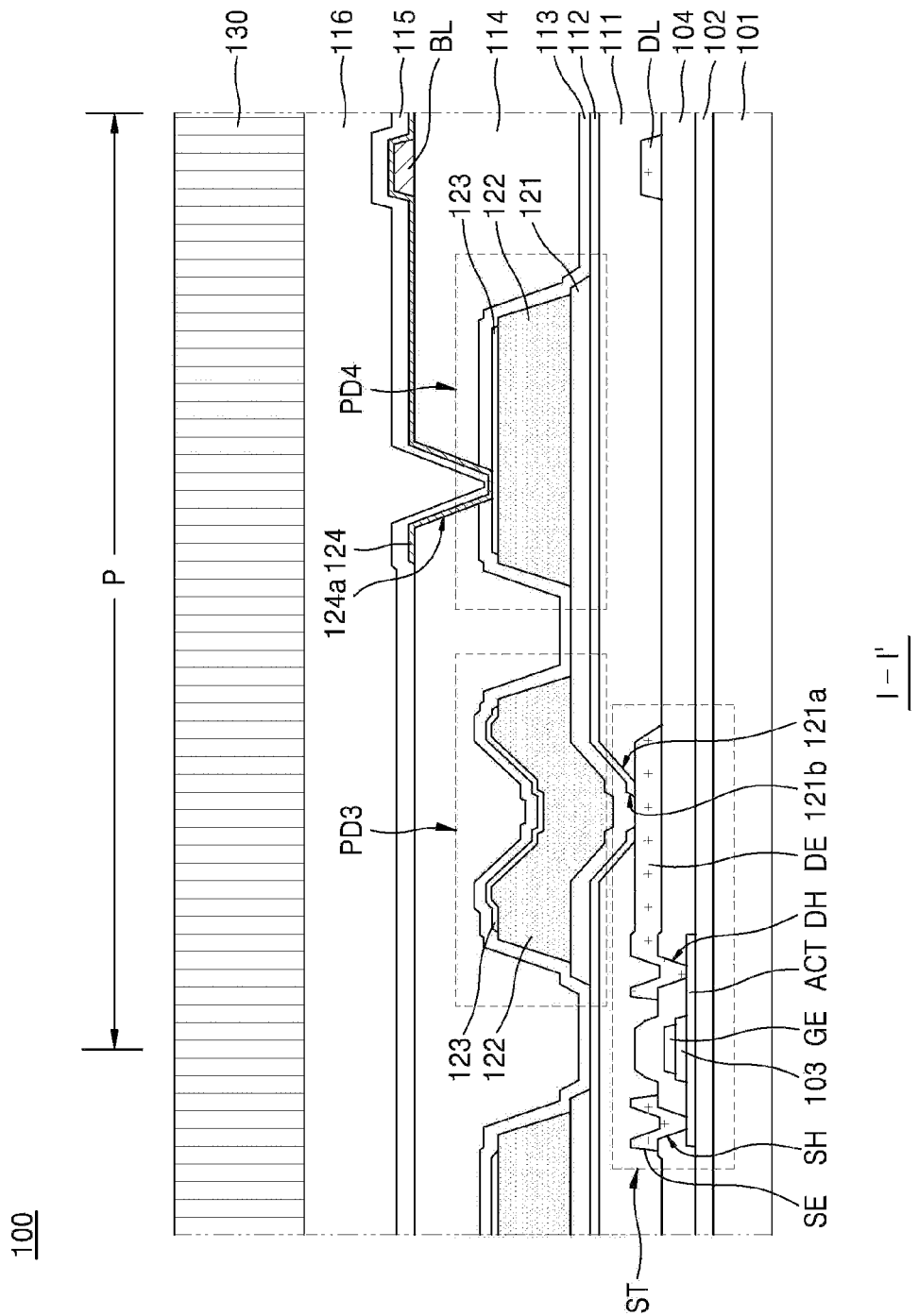
FIG. 4 shows a cross-sectional view taken along line I-I' of FIG. 3.

As shown in FIG. 4, the pixel array panel 100 includes a substrate 101 containing the pixel regions (P in FIG. 3), a switching thin film transistor ST disposed on the substrate 101 and corresponding to each pixel region P, a first planarization film 111 covering the switching thin film transistor ST, a first protective film 112 disposed on the first planarization film 111, a first electrode 121 disposed on the first protective film 112 and corresponding to each pixel region P, a plurality of PIN layers 122 disposed on the first electrode 121 and arranged in a matrix form, and a second electrode 123 disposed on each PIN layer 122.

In this connection, the substrate 101 is made of a soft material. In one example, the substrate 101 may be made of one selected from PET (polyethylene terephthalate), PEN (ethylene naphthalate), PI (polyimide), PMMA (polymethyl methacrylate), PC (polycarbonate), PS (polystyrene) and PES (polyethersulfone). In particular, substrate 101 may be made of PI having relatively high accessibility.

In order to more easily fix a semiconductor material or an inorganic material on the substrate 101, the pixel array panel 101 may further include a buffer layer 102 disposed on an entire face of the substrate 101. For example, the buffer layer 102 may be made of an inorganic insulating material such as SiNx, SiO, or the like.

When the switching thin film transistor ST includes an active layer ACT disposed on the substrate 101 (or on the buffer layer 102 when the buffer layer 102 is present), a gate insulating layer 103 disposed on a partial region of the active layer ACT, a gate electrode GE disposed on the gate insulating layer 103 and connected to the gate line GL, an interlayer insulating film 104 covering the active layer ACT and the gate electrode GE, and a source electrode SE and a drain electrode DE disposed on the interlayer insulating film 104.

In this connection, one of the source electrode SE and the drain electrode DE, for example, the drain electrode DE is connected to the first electrode 121 via the first and second pixel contact holes 121a and 122b, while the other thereof, for example, the source electrode SE is connected to the data line DL.

In this connection, the first pixel contact hole 121a penetrates the first planarization film 111 covering the switching thin film transistor ST. The second pixel contact hole 121b corresponds to the first pixel contact hole 121a, and passes through the first protective film 112 on the first planarization film 111.

Referring to FIG. 3, the gate electrode GE may be composed of a portion of the gate line GL extending in the horizontal direction perpendicular to the active layer ACT of each switching transistor ST.

The source electrode SE may be composed of a portion branching from the data line DL toward the active layer ACT of each switching transistor ST.

Accordingly, the data line DL together with the source electrode SE and the drain electrode DE are disposed on the interlayer insulating film 104.

The active layer ACT includes a channel region overlapped with the gate electrode GE, and a source region and a drain region disposed around the channel region. For example, the active layer ACT may be made of one selected from amorphous silicon material, LTPS (low temperature polycrystalline silicon) material and oxide semiconductor material.

The source electrode SE is connected to a source region of the active layer ACT via a source contact hole SH which passes through the interlayer insulating film 104.

The drain electrode DE is connected to a drain region of the active layer ACT via a drain contact hole DH which passes through the interlayer insulating layer 104.

This source electrode SE, drain electrode DE, and data line DL are covered by the first planarization film 111. The first planarization film 111 is covered with a first protective film 112.

The first planarization film 111 may be made of an insulating material that can be laminated to a thickness equal to or greater than a threshold thickness so as to provide a flat surface regardless of a type of a wiring or pattern. For example, the first planarization film 111 may be made of an organic insulating material such as an acrylic resin such as PAC (photo acryl). Alternatively, the first planarization film 111 may be made of PR (photo resist) or the like.

Due to the planarization film 111, the parasitic capacitance between the conductive pattern such as the switching thin film transistor ST, the gate line GL, and the data line DL and the photo-sensing elements PD3 and PD4 may be reduced.

The first protective film 112 on the first planarization film 111 may be made of an inorganic insulating material such as SiNx, SiO, or the like. Since the first protective film 112 may prevent penetration of moisture or oxygen, the semiconductor characteristics of the active layer ACT may be maintained. Further, due to the first protective film 112, fixation of the first electrode 121 disposed on the first protective film 112 may be reliable.

The first electrode 121 may be disposed in an area as wide as possible in the pixel region P, with taking into consideration the fill factor of each pixel region P. For example, the first electrode 121 may be embodied as a single layer or a multilayer structure made of an opaque metal such as molybdenum Mo or a transparent conductive material such as ITO (Indium Tin Oxide), IZO (Indium Zinc Oxide), and ZnO (Zinc Oxide).

The plurality of mutually spaced PIN layers 122 are arranged in a matrix on the first electrode 121.

Each PIN layer 122 may have a structure in which an N (negative) type semiconductor layer including an N type impurity, an I (intrinsic) type semiconductor layer not including an impurity, and a P (positive) type semiconductor layer including a P type impurity are sequentially stacked vertically. In this connection, the I-type semiconductor layer may be relatively thicker than each of the N-type semiconductor layer and the P-type semiconductor layer. The PIN layer 122 may have a thickness of about 1 μm.

The PIN layer 122 includes a material having ability to convert an X-ray emitted from a light-source device (12 in FIG. 1) into an electrical signal. For example, the PIN layer 122 may include at least one of a-Se, HgI2, CdTe, PbO, PbI2, BiI3, GaAs, and Ge.

A spacing between two PIN layers 122 adjacent to each other in the horizontal direction or the vertical direction among the plurality of PIN layers 122 may be 2 μm or greater. This range is set with taking into account a process error in forming the PIN layer 122.

The second electrode 123 disposed on each PIN layer 122 covers most of the PIN layer 122. The second electrode 123 is made of a transparent conductive material in order to prevent a decrease in an amount of incident light to each PIN layer 122 and a decrease in the fill factor of each pixel region P. For example, the second electrode 123 may be made of one selected from ITO (Indium Tin Oxide), IZO (Indium Zinc Oxide) and ZnO (Zinc Oxide).

The pixel array panel 100 according to an aspect of the present disclosure further includes a second protective film 113 covering the PIN protective layer 122 and the second electrode 123, a second planarization film 114 disposed on the second protective film 113, a bias line BL disposed on the second planarization film 114, and a bridge pattern 124 disposed on the second planarization film 114 and connecting each second electrode 123 and the bias line GL to each other.

Like the first protective film 112, the second protective film 113 may be made of an inorganic insulating material such as SiNx, SiO, or the like.

Like the first planarization film 111, the second planarization film 114 may be made of an organic insulating material such as acrylic resin such as photo acryl (PAC) or PR (photo resist).

The bias line BL may be disposed so as to overlap the data line DL when the bias line BL extends in the vertical direction like the data line DL.

The bridge pattern 124 is connected to at least one second electrode 123 via a bias contact hole 124a. In this connection, the bias contact hole 124a corresponds to at least a portion of each second electrode 123 and passes through the second protective film 113 and second planarization film 114.

The bridge pattern 124 defines the same layer as the bias line BL. The bridge pattern 124 may overlap with at least a portion of the bias line BL, such that the bridge pattern 124 contacts and is connected to the bias line BL.

The bridge pattern 124 may be made of a transparent conductive material in order to prevent a decrease in an amount of incident light to each PIN layer 122 and a decrease in the fill factor of each pixel region P. That is, like the second electrode 123, the bridge pattern 124 may be made of one selected from ITO (Indium Tin Oxide), IZO (Indium Zinc Oxide), and ZnO (Zinc Oxide). However, this is only an example. In another example, the bridge pattern 124 may be made of a metal material such as Al, Cu, or Mg to improve reliability of and reduce resistance to electrical connection between the bias line BL and the second electrode 123. Alternatively, the bridge pattern 124 may have a stack structure between a transparent conductive material and a metal material.

Further, the pixel array panel 100 according to an aspect of the present disclosure may further include a third protective film 115 covering the bias line BL and the bridge pattern 124, a third planarization film 116 disposed on the third protective film 115, and a scintillator 130 disposed on the third planarization film 116

Like the first protective film 112, the third protective film 115 may be made of an inorganic insulating material such as SiNx, SiO, or the like.

Like the first planarization film 111, the third planarization film 116 may be made of an organic insulating material such as acrylic resin such as photo acryl (PAC) or PR (photo resist).

The scintillator 130 converts the X-ray into visible light. The scintillator 130 may have a columnar structure. For example, the scintillator 130 may be composed of Thallium doped Cesium Iodide (CsI(Tl)).

As described above, the pixel array panel 100 for a digital X-ray detector according to an aspect of the present disclosure includes the first electrode 121 corresponding to each pixel region P, the plurality of PIN layers 122 arranged in a matrix on the first electrode 121, and each second electrode 123 arranged on each PIN layer 122. Accordingly, when the pixel array panel 100 is implemented in a bent shape, the bending stress corresponding to each pixel region P is dispersed to between the plurality of PIN layers 122. Thus, the bending stress applied to each PIN layer 122 may be relatively reduced. Thereby, cracking or breakage of the PIN layer 122 due to the bending stress may be reduced. Further, since the crack or damage of the PIN layer is reduced, occurrence of the pixel region where the photo sensitivity is lowered compared to other pixel regions in the vicinity thereto may be reduced. Thus, the deterioration in the accuracy and reliability of the X-ray image due to the bending shape may be prevented. Therefore, the pixel array panel may be advantageously implemented in a bendable or flexible manner. As a result, the field to which the digital X-ray detector including the pixel array panel is applied may be extended.

Next, a manufacturing process of the pixel array panel 100 according to an aspect of the present disclosure will be described with reference to FIGS. 5 to 17.

FIG. 5, FIG. 6, FIG. 7, FIG. 8, FIG. 9, FIG. 10, FIG. 11, FIG. 12, FIG. 13, FIG. 14, FIG. 15, FIG. 16, and FIG. 17 are cross-sectional views taken along a line I-I' of FIG. 3 of intermediate structures when producing a pixel array panel according to an aspect of the present disclosure.

An arrangement method or a formation method of each component as described below, for example, a photolithography process including a deposition, a photoresist coating (PR coating), an exposure, a development, an etching, and a photoresist (PR) strip is well known to a person skilled to the art, and thus, a detailed description thereof will be omitted. For example, for deposition of a metal material, sputtering is used. For deposition of a semiconductor or insulating film, PECVD (Plasma Enhanced Vapor Deposition is used. Regarding the etching, dry etching and wet etching may be selectively used depending on the material.

Figure 5:
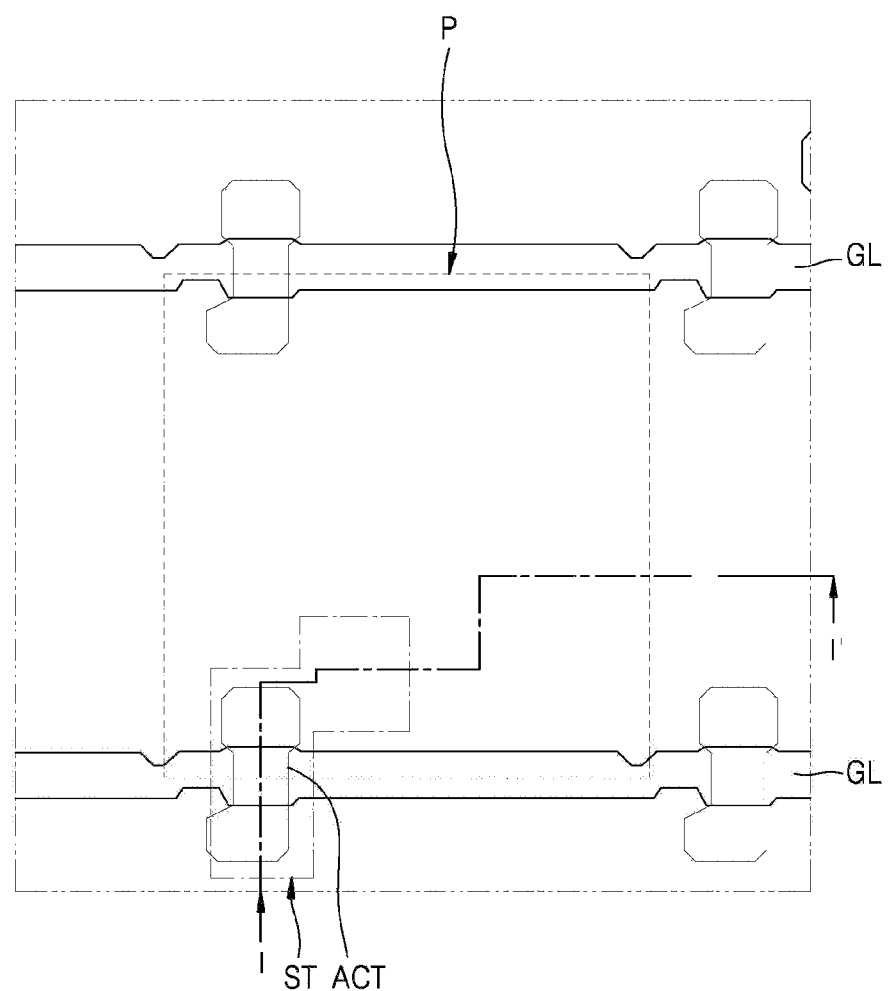
FIG. 5, FIG. 6, FIG. 7, FIG. 8, FIG. 9, FIG. 10, FIG. 11, FIG. 12, FIG. 13, FIG. 14, FIG. 15, FIG. 16, and FIG. 17 are cross-sectional views taken along line I-I' of FIG. 3 of intermediate structures when producing a pixel array panel according to an aspect of the present disclosure.
Figure 6:
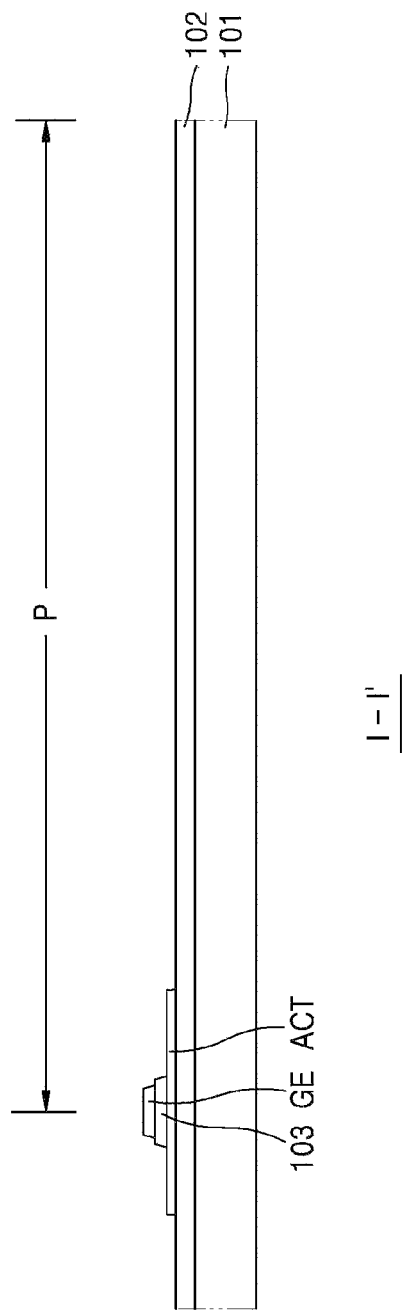

As shown in FIG. 5 and FIG. 6, the substrate 101 made of a soft material is provided. Then, the buffer film 102 is disposed entirely on the substrate 101. Next, the active layer ACT corresponding to each pixel region P is disposed on the buffer film 102.

The gate insulating film 103 and the gate line GL are formed on the buffer film 102 by patterning an insulating film and a conductive film on the active layer ACT. In this connection, the gate line GL extends in the horizontal direction on the gate insulating film 103. The gate insulating film 103 may have the same pattern as the gate line GL.

The gate line GL overlaps at least a portion of the active layer ACT while the gate insulating film 103 is disposed therebetween. In this connection, a portion of the gate line GL overlapped with the active layer ACT acts as the gate electrode GE of the switching thin film transistor ST. The portion of the active layer ACT which overlaps with the gate electrode GE acts as a channel region for transferring charges based on the potential of the gate electrode GE.

Figure 7:
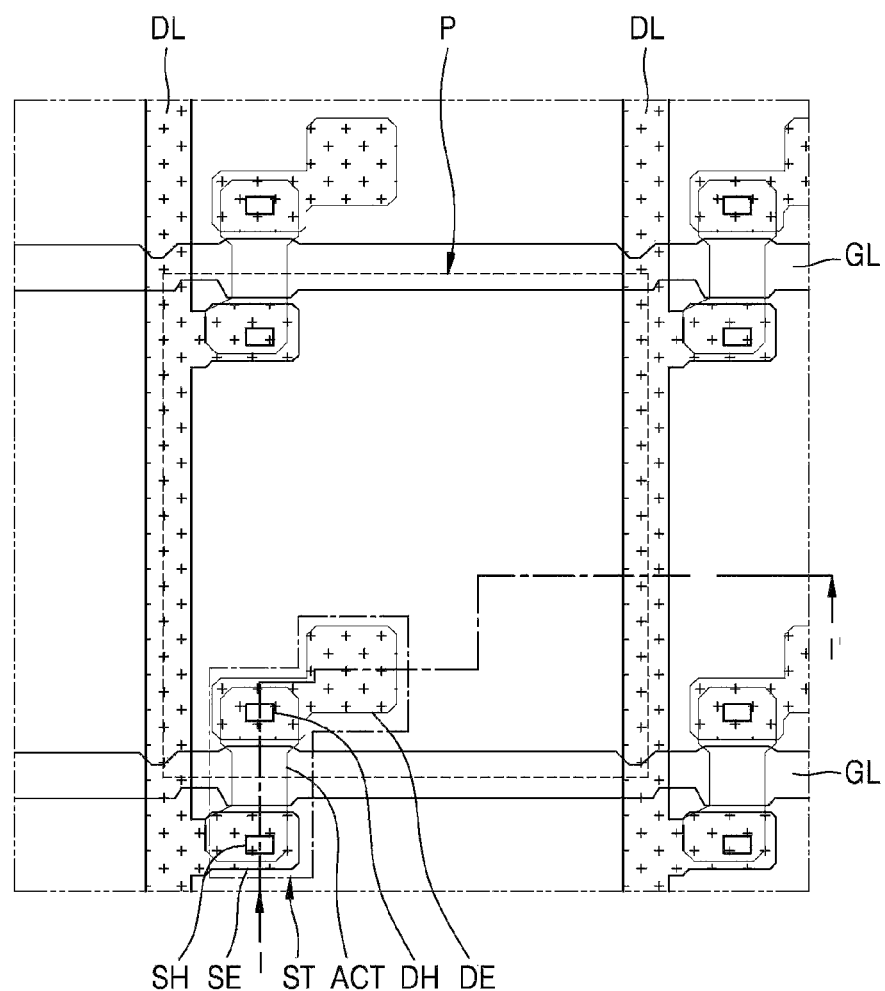
Figure 8:
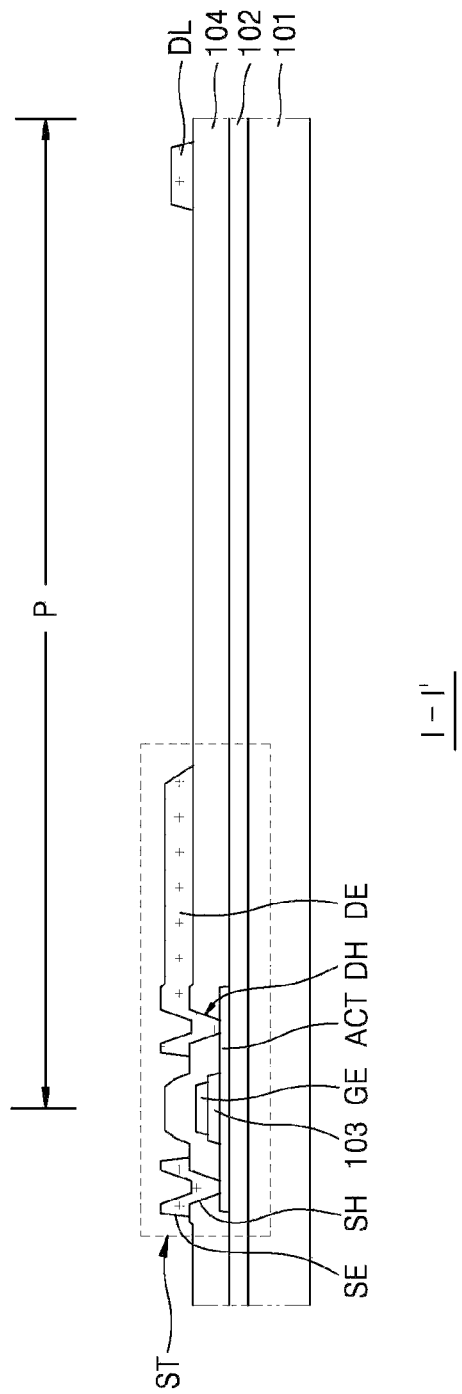

As shown in FIGS. 7 and 8, the interlayer insulating film 104 is disposed entirely on the buffer film 102. In this connection, the interlayer insulating film 104 covers the gate line GL including the gate electrode GE and a remaining portion of the active layer ACT. Then, the interlayer insulating film 104 is patterned so that a source contact hole SH corresponding to at least a portion of a source region of the active layer ACT and a drain contact hole DH corresponding to at least a portion of a drain region of the active layer ACT are formed in the interlayer insulating film 104. Next, a conductive film on the interlayer insulating film 104 is patterned such that the source electrode SE connected to the source region of the active layer ACT via the source contact hole SH, the drain electrode DE connected to the drain region of the active layer ACT via the drain contact hole DH, and the data line DL extending in the vertical direction and connected to the source electrode SE are disposed on the interlayer insulating film 104.

In this way, the switching thin film transistor ST including the active layer ACT, the gate electrode GE, the source electrode SE, and the drain electrode DE is provided.

Figure 9:
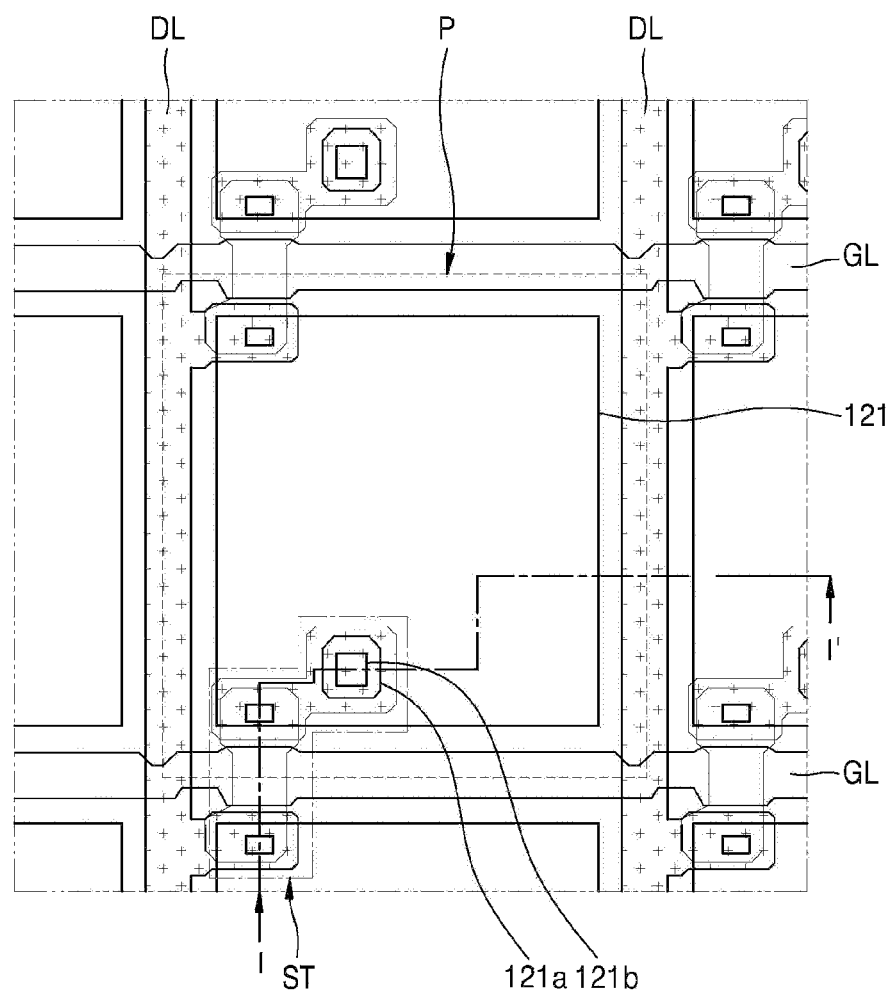
Figure 10:
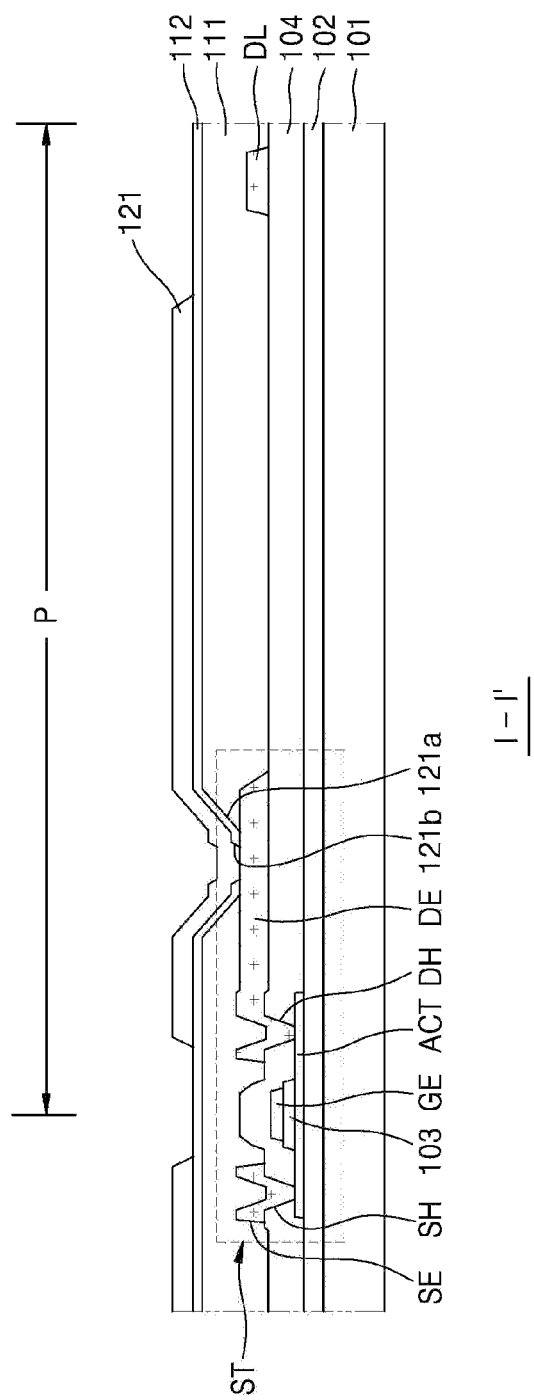

As shown in FIG. 9 and FIG. 10, the first planarization film 111 is disposed entirely on the interlayer insulating film 104. In this connection, the first planarization film 111 covers the source electrode SE, the drain electrode DE and the data line GL of the switching thin film transistor ST. Then, the first planarization film 111 is patterned so that the first pixel contact hole 121a corresponding to at least a portion of the drain electrode DE of the switching thin film transistor ST is formed in the first planarization film 111.

The first protective film 112 is then disposed entirely on the first planarization film 111 including the first pixel contact hole 121a. Subsequently, the first protective film 112 is patterned so that the second pixel contact hole 121b corresponding to the first pixel contact hole 121a is formed in the first protective film 112.

Next, a conductive film on the first protective film 112 is patterned so that the first electrode 121 corresponding to each pixel region P is disposed on the first protective film 112. In this connection, the first electrode 121 is connected to the drain electrode DE of the switching thin film transistor ST via the first and second pixel contact holes 121a and 121b.

Figure 11:
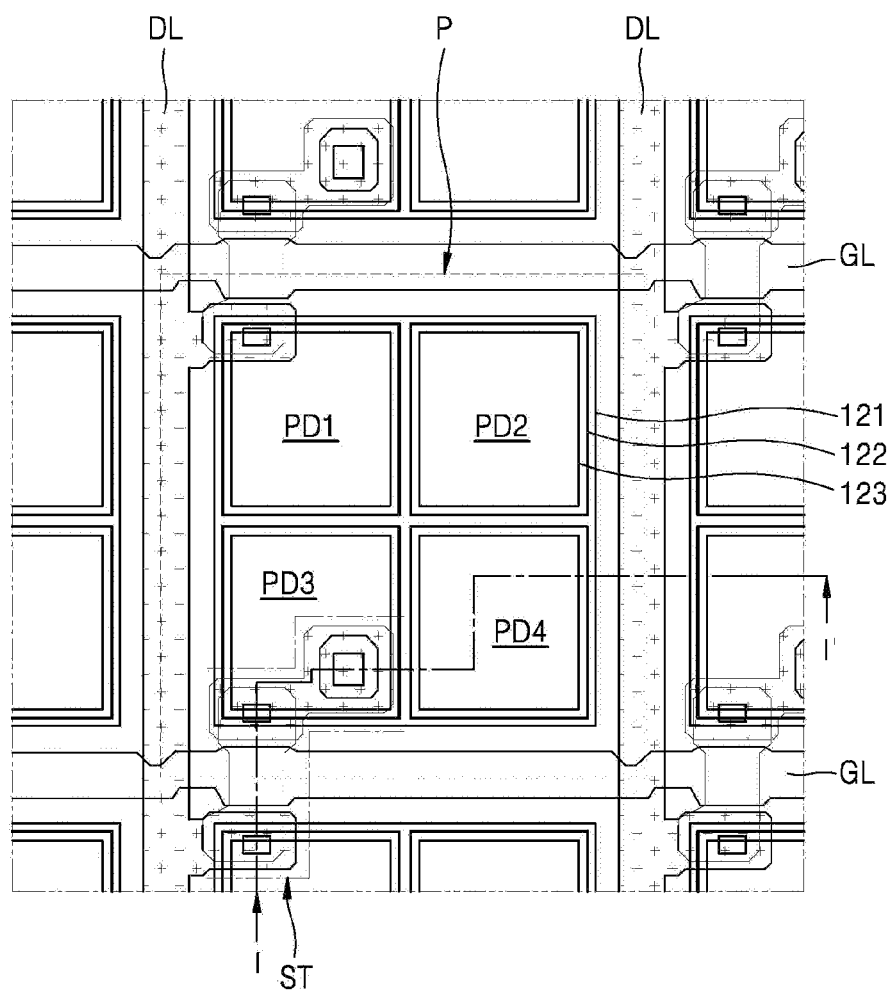
Figure 12:
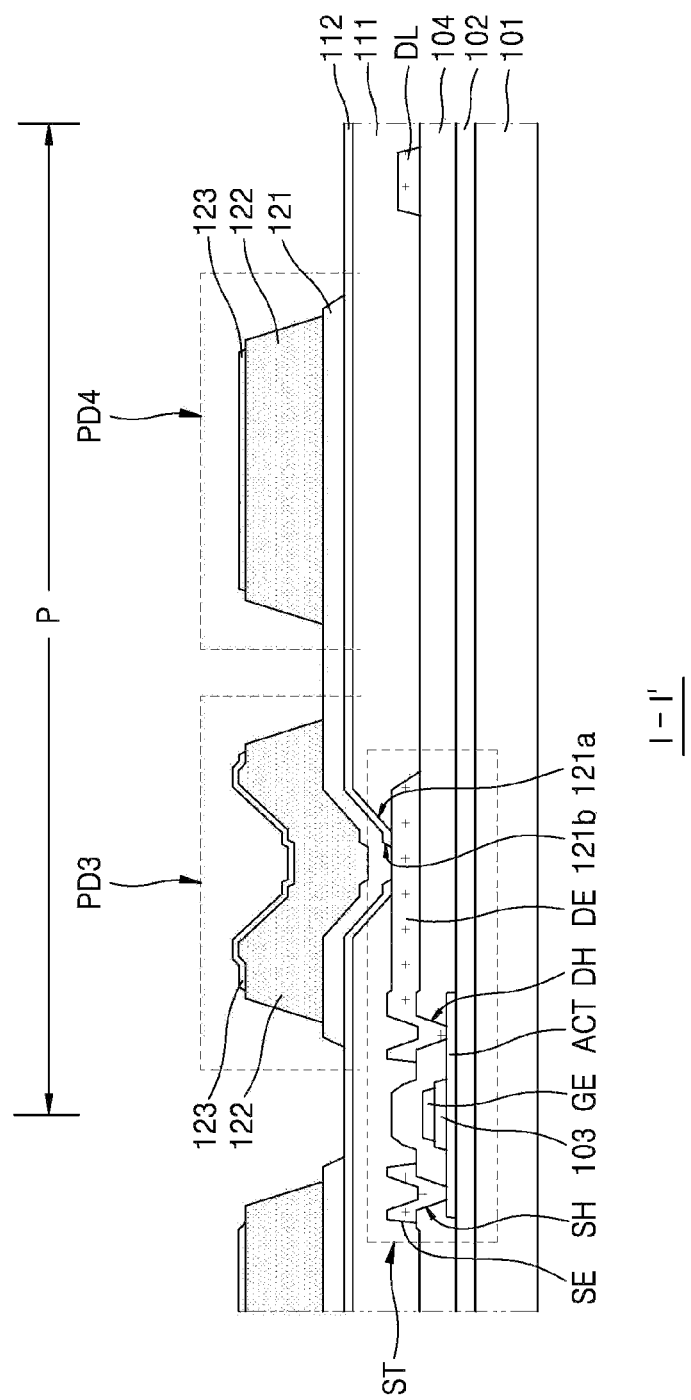

As shown in FIGS. 11 and 12, the plurality of mutually-spaced and matrix-arranged of PIN layers 122 are disposed on the first electrode 121. Each second electrode 123 is disposed on each PIN layer 122.

In this manner, the photo-sensing elements PD1, PD2, PD3, and PD4 composed of the first electrode 121, the PIN layers 122, and the second electrodes 123 respectively are provided.

Figure 13:
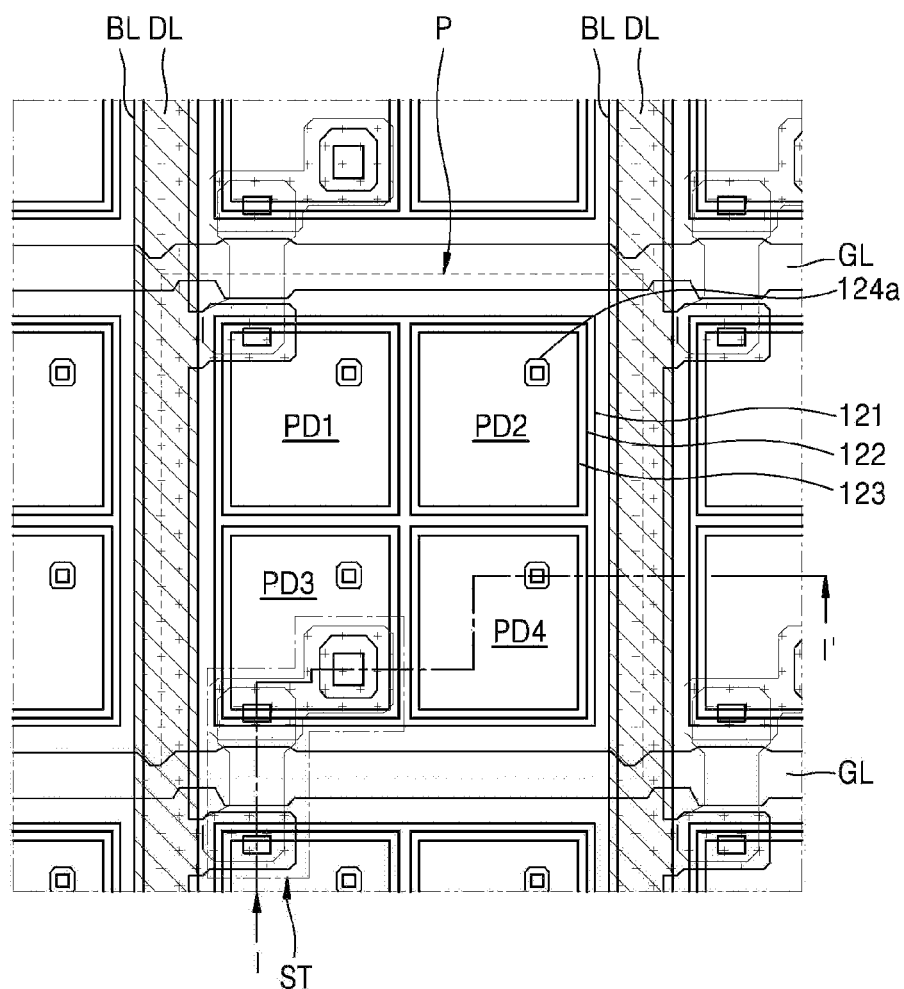
Figure 14:
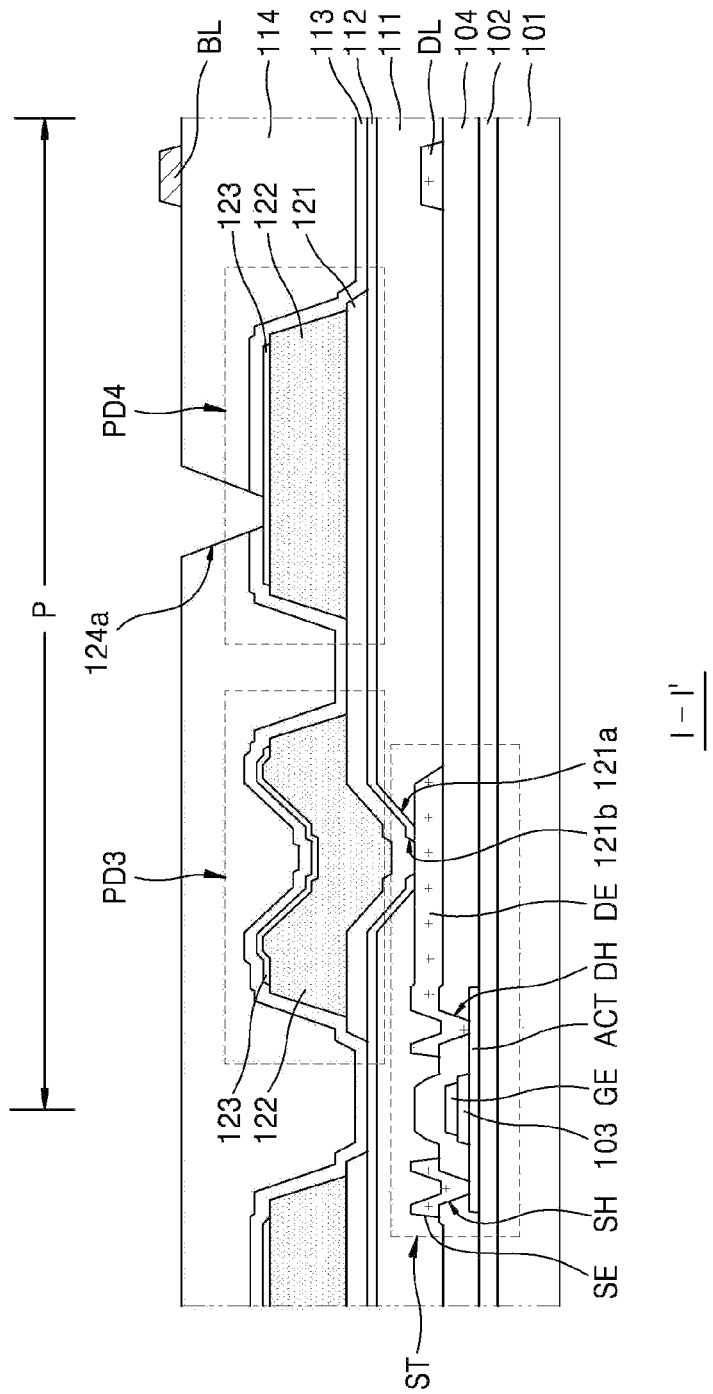

As shown in FIG. 13 and FIG. 14, the second protective film 113 is disposed entirely on the first protective film 112. In this connection, the second protective film 113 covers the first electrode 121, the PIN layers 122, and the second electrodes 123. In particular, in a separation region between adjacent PIN layers 122, the second protective film 113 contacts the first electrode 121.

A second planarization film 114 is then disposed entirely on the second protective film 113.

Next, the bias line BL extending in the vertical direction is disposed on the second planarization film 114. In this connection, the bias line GL may overlap the data line DL.

Then, the third protective film 113 and the second planarization film 114 are patterned to provide the bias contact hole 124a corresponding to at least a portion of each second electrode 123.

Figure 15:
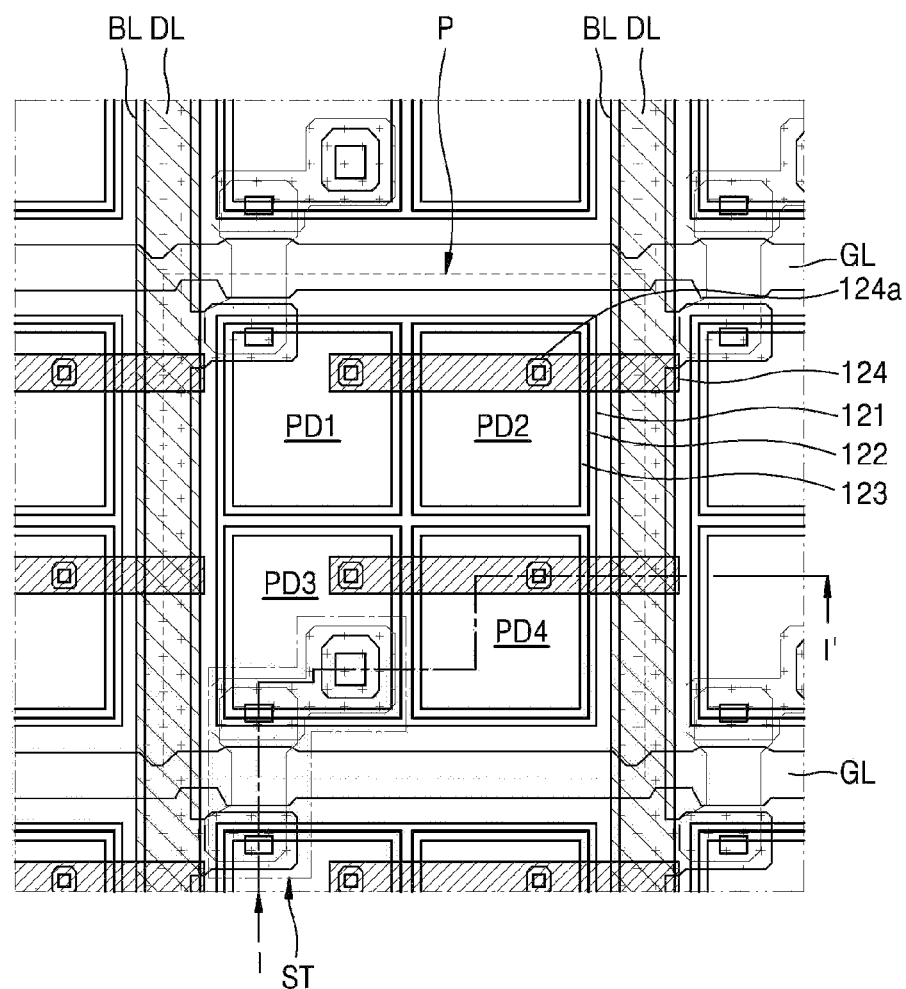
Figure 16:
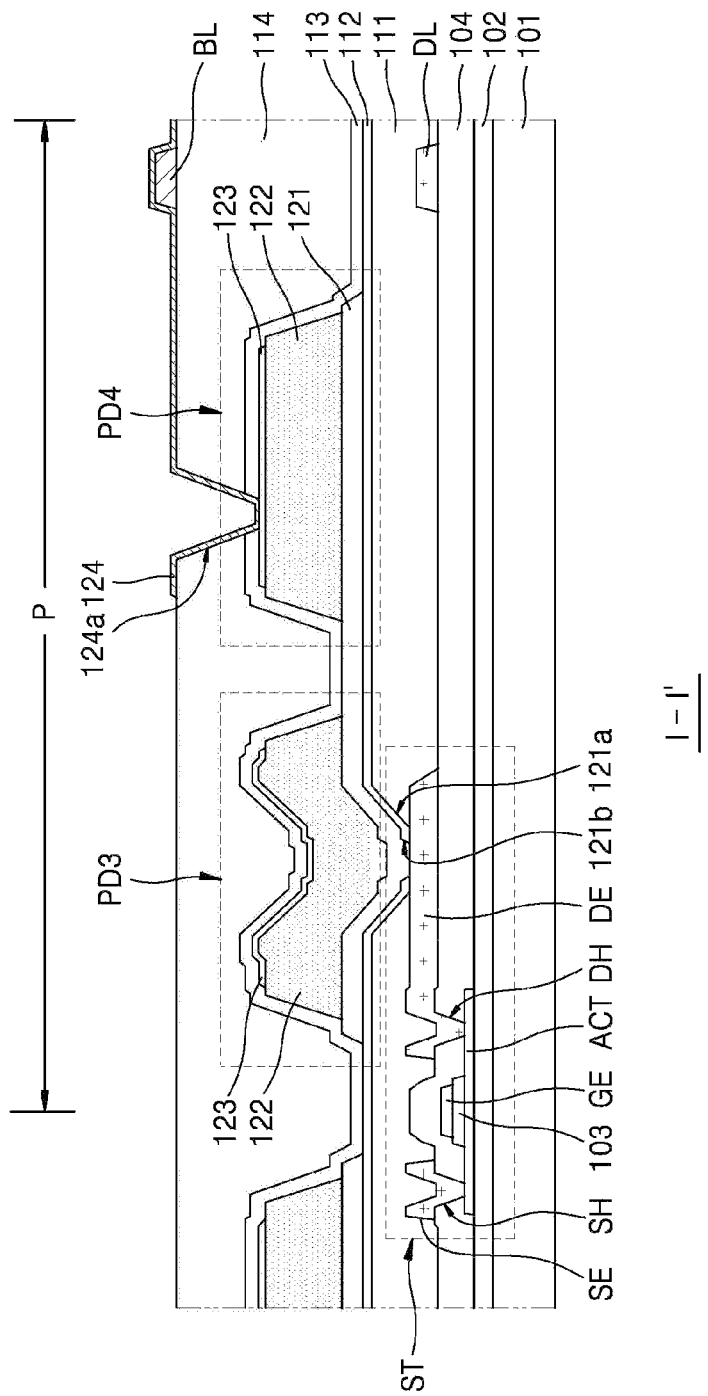

As shown in FIG. 15 and FIG. 16, the bridge pattern 124 connecting at least two second electrode 123 and the bias line BL to each other is disposed on the second planarization film 114. In this connection, the bridge pattern 124 is connected to the second electrode 123 via the bias contact hole 124a. The bridge pattern 124 is connected to the bias line BL while contacting at least a portion of the bias line BL.

Figure 17:
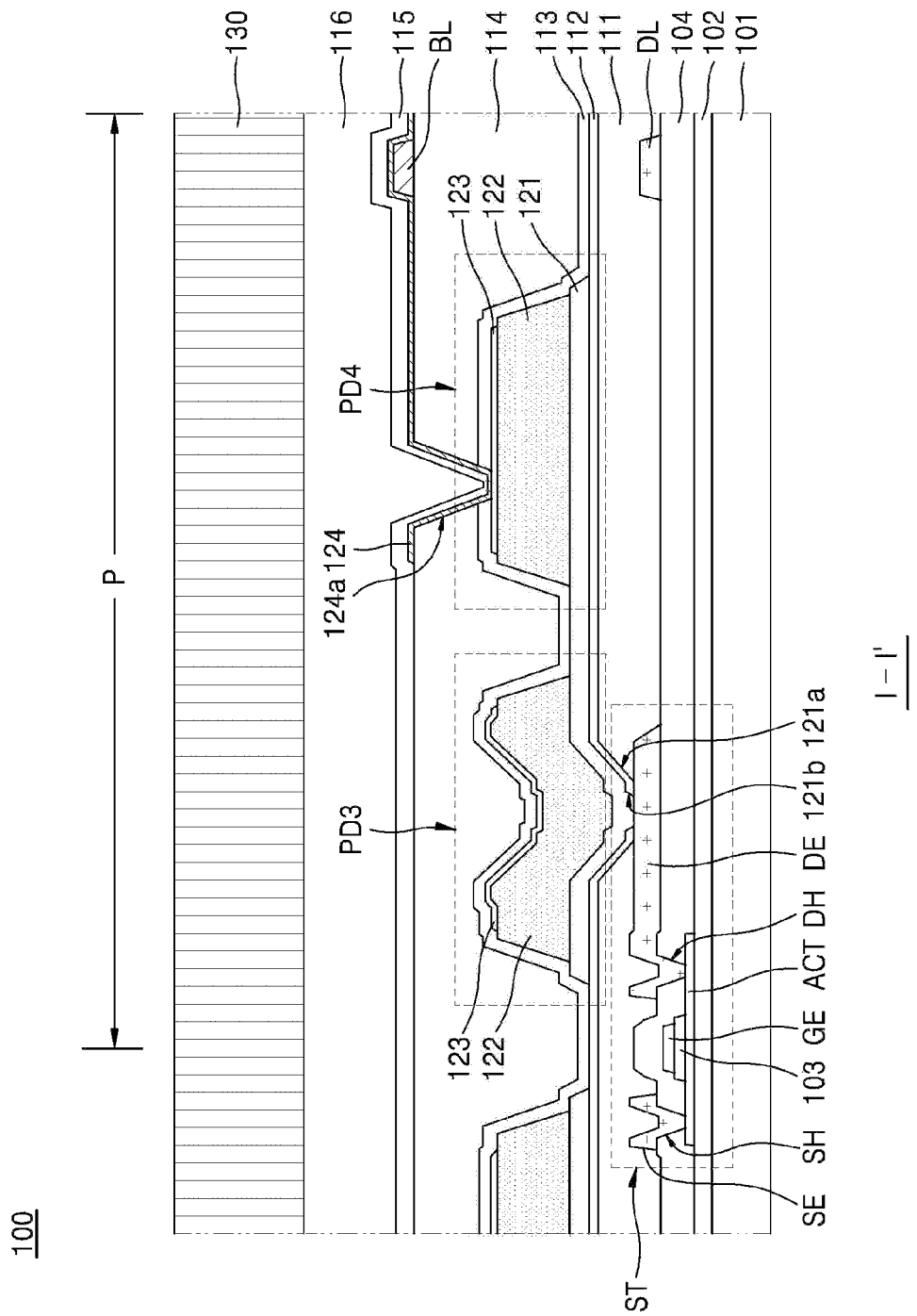

Next, as shown in FIG. 17, the third protective film 115 is disposed entirely on the second planarization film 114. In this connection, the third protective film 115 covers the bias line BL and the bridge pattern 124.

The third planarization film 116 is disposed entirely on the third protective film 115.

Next, the scintillator 130 is disposed on the third planarization film 116.

In this way, the pixel array panel 100 according to an aspect of the present disclosure is realized.

The present disclosure as described above is not limited to the above-described aspect and the accompanying drawings. It will be apparent to those skilled in the art that various changes, substitutions, and alterations without departing from the spirit and scope of the present disclosure will be apparent to those skilled in the art to which the present disclosure pertains.

What is claimed is:

1. A pixel array panel for a digital X-ray detector, comprising:
    a plurality of pixel regions;
    wherein the each pixel region includes:
    a first electrode corresponding to each pixel region;
    a plurality of PIN layers disposed on the first electrode; and
    a plurality of second electrodes, each second electrode disposed on each PIN layer,
    wherein each PIN layer and each second electrode are disposed in the plurality of pixel regions.

2. The pixel array panel of claim 1, further comprising:
    a substrate where the plurality of pixel regions is defined;
    a thin film transistor disposed on the substrate and corresponding to each pixel region;
    a first planarization film covering the thin film transistor;
    a first protective film disposed on the first planarization film;
    a second protective film disposed on the first protective film and covering the first electrode, the PIN layers and the second electrode;
    a second planarization film disposed on the second protective film;
    a bias line disposed on the second planarization film; and
    a bridge pattern disposed on the second planarization film and connecting each second electrode to the bias line,
    wherein the first electrode is disposed on the first protective film, and
    wherein the bridge pattern is connected to each second electrode via a bias contact hole which passes through the second protective film and the second planarization film and the bridge pattern overlaps at least a portion of the bias line.

3. The pixel array panel of claim 2, wherein the first electrode is in contact with the second protective film in a space region between adjacent PIN layers among the plurality of PIN layers corresponding to each pixel region.

4. The pixel array panel of claim 2, wherein a spacing between two adjacent PIN layers among the plurality of PIN layers corresponding to each pixel region is 2 µm or greater.

5. The pixel array panel of claim 2, wherein the bias line extends in a first direction, and
    wherein the bridge pattern is connected to at least two second electrodes arranged in a second direction intersecting with the first direction.

6. The pixel array panel of claim 2, wherein the first electrode of each pixel region is connected to the thin film transistor of each pixel region via a first pixel contact hole which passes through the first planarization film and a second pixel contact hole which corresponds to the first pixel contact hole and passes through the first protective film.

7. The pixel array panel of claim 6, wherein the thin film transistor includes:
    an active layer disposed on the substrate;
    a gate insulating layer disposed on a portion of the active layer;
    a gate electrode disposed on the gate insulating layer and connected to a gate line;
    an interlayer insulating film covering the active layer and the gate electrode; and
    a source electrode and a drain electrode which are disposed on the interlayer insulating film,
    wherein one of the source electrode and the drain electrode is connected to the first electrode via the first and second pixel contact holes, while the other thereof is connected to the data line.

8. The pixel array panel of claim 7, wherein the gate line extends in a first direction and is disposed on the gate insulating layer, and
    wherein the data line extends in a second direction intersecting with the first direction and is disposed on the interlayer insulating film.

9. The pixel array panel of claim 8, wherein the bias line extends in the second direction and overlaps with the data line.

10. The pixel array panel of claim 2, wherein the pixel array panel further includes:
    a third protective film covering the bias line and the bridge pattern;
    a third planarization film disposed on the third protective film; and
    a scintillator disposed on the third planarization film.

11. The pixel array panel of claim 2, wherein the substrate is made of a soft material.

12. A digital X-ray detector including the pixel array panel, comprising:
    a plurality of pixel regions;
    wherein the each pixel region includes:
    a first electrode;
    a plurality of PIN layers disposed on the first electrode; and
    a plurality of second electrodes, each second electrode disposed on each PIN layer,
    wherein each PIN layer and each second electrode are disposed in the plurality of pixel regions.

13. The digital X-ray detector of claim 12, further comprising:
    a substrate where the plurality of pixel regions is defined;
    a thin film transistor disposed on the substrate and corresponding to each pixel region;
    a first planarization film covering the thin film transistor;
    a first protective film disposed on the first planarization film;
    a second protective film disposed on the first protective film and covering the first electrode, the PIN layers and the second electrode;
    a second planarization film disposed on the second protective film;
    a bias line disposed on the second planarization film; and
    a bridge pattern disposed on the second planarization film and connecting each second electrode to the bias line, wherein the first electrode is disposed on the first protective film, and wherein the bridge pattern is connected to each second electrode via a bias contact hole which passes through the second protective film and the second planarization film and the bridge pattern overlaps at least a portion of the bias line.

14. The digital X-ray detector of claim 13, wherein the first electrode is in contact with the second protective film in a space region between adjacent PIN layers among the plurality of PIN layers corresponding to each pixel region.

15. The digital X-ray detector of claim 13, wherein a spacing between two adjacent PIN layers among the plurality of PIN layers corresponding to each pixel region is 2 μm or greater.

16. The digital X-ray detector of claim 13, wherein the bias line extends in a first direction, wherein the bridge pattern is connected to at least two second electrodes arranged in a second direction intersecting with the first direction.

17. The digital X-ray detector of claim 13, wherein the first electrode of each pixel region is connected to the thin film transistor of each pixel region via a first pixel contact hole which passes through the first planarization film and a second pixel contact hole which corresponds to the first pixel contact hole and passes through the first protective film.

18. The digital X-ray detector of claim 17, wherein the thin film transistor includes:

an active layer disposed on the substrate;

a gate insulating layer disposed on a portion of the active layer;

a gate electrode disposed on the gate insulating layer and connected to a gate line;

an interlayer insulating film covering the active layer and the gate electrode; and a source electrode and a drain electrode which are disposed on the interlayer insulating film, wherein one of the source electrode and the drain electrode is connected to the first electrode via the first and second pixel contact holes while the other thereof is connected to the data line.

19. The digital X-ray detector of claim 18, wherein the gate line extends in a first direction and is disposed on the gate insulating layer, wherein the data line extends in a second direction intersecting with the first direction and is disposed on the interlayer insulating film, and wherein the bias line extends in the second direction and overlaps the data line.

20. The digital X-ray detector of claim 13, wherein the pixel array panel further includes:

a third protective film covering the bias line and the bridge pattern;

a third planarization film disposed on the third protective film; and a scintillator disposed on the third planarization film.

* * * * *